United States Patent [19]
Fang et al.

[11] Patent Number: 5,661,042
[45] Date of Patent: Aug. 26, 1997

[54] PROCESS FOR ELECTRICALLY CONNECTING ELECTRICAL DEVICES USING A CONDUCTIVE ANISOTROPIC MATERIAL

[75] Inventors: Treliant Fang, Chandler; Lih-Tyng Hwang, Phoenix; William M. Williams, Gilbert, all of Ariz.

[73] Assignee: Motorola, Inc., Schaumburg, Ill.

[21] Appl. No.: 520,118

[22] Filed: Aug. 28, 1995

[51] Int. Cl.⁶ .................. H01L 21/288; H01L 21/58; H01L 21/60
[52] U.S. Cl. .................. 438/17; 438/119; 324/757; 156/325
[58] Field of Search .................................. 437/8, 183

[56] References Cited

U.S. PATENT DOCUMENTS

| | | |
|---|---|---|
| 4,281,449 | 8/1981 | Ports et al. . |
| 4,583,042 | 4/1986 | Riemer .................. 324/73 PC |
| 4,705,205 | 11/1987 | Allen et al. .................. 228/180.2 |
| 4,737,112 | 4/1988 | Jin et al. .................. 349/66 |
| 4,968,931 | 11/1990 | Littlebury et al. . |
| 5,042,919 | 8/1991 | Yabu et al. .................. 359/88 |
| 5,136,365 | 8/1992 | Pennisi et al. .................. 357/72 |
| 5,206,585 | 4/1993 | Chang et al. . |
| 5,302,854 | 4/1994 | Nishiguchi et al. .................. 257/737 |
| 5,317,255 | 5/1994 | Suyama et al. . |
| 5,328,087 | 7/1994 | Nelson et al. .................. 228/175 |
| 5,428,190 | 6/1995 | Stopperan .................. 174/261 |
| 5,434,452 | 7/1995 | Higgins, III .................. 257/773 |
| 5,438,223 | 8/1995 | Higashi et al. .................. 257/774 |
| 5,453,701 | 9/1995 | Jensen et al. .................. 324/755 |
| 5,509,815 | 4/1996 | Jin et al. .................. 349/91 |

OTHER PUBLICATIONS

SPIE (The Society of Photo–Optical Instumentation Engineers) International Conference and Exhibition; Multichip Modules; Apr. 13–15, 1994, Denver Colorado, vol. 2256, pp. iv–viii and 34–40.

*Primary Examiner*—David E. Graybill
*Attorney, Agent, or Firm*—Kevin B. Jackson

[57] ABSTRACT

A process for using removable Z-axis anisotropically conductive adhesive material (21) which includes water, a matrix resin (23), and conductive spheres (22). The material (21) is suitable for providing temporary contact between electronic devices. In one embodiment, the material (21) is used to temporarily bond a semiconductor wafer (11) to a probe substrate (12) for wafer-level burn-in.

7 Claims, 3 Drawing Sheets

PROCESS FOR ELECTRICALLY CONNECTING ELECTRICAL DEVICES USING A CONDUCTIVE ANISOTROPIC MATERIAL

BACKGROUND OF THE INVENTION

This invention relates, in general, to electronic devices, and more particularly, to materials and methods for providing temporary electrical contact.

Prior to shipping integrated circuit (IC) devices, semiconductor manufacturers generally screen the IC devices to ensure their reliability. Often, a burn-in testing process is used whereby a device is operated at a predetermined temperature level (typically at a fixed temperature in a range from about 85° C. to about 150° C.) over a prolonged period. Power is applied to certain contacts on the device during the burn-in period and performance is measured by monitoring output signals from the device. The burn-in process serves to screen out those devices that are susceptible to premature failure from, for example, latent defects.

Considerable interest exists in methods for performing wafer-level burn-in (WLBI) of IC devices to determine known good die per wafer before wafers are separated into individual devices. The attractiveness of WLBI over die-level burn-in techniques is due to its promise of simplicity, reliability, and low cost. One problem associated with WLBI is the lack of cost effective and reliable suitable for temporarily contacting a wafer to be tested to a test or probe substrate. One prior art method for WLBI includes using an anisotropically conductive rubber sheet sandwiched between a wafer to be tested and a probe substrate. One disadvantage with anisotropically conductive rubber sheets is the need to use a clamping device throughout the burn-in process to hold the wafer, the rubber sheet, and the probe substrate together to ensure good contact. Clamping devices are bulky and require frequent adjustment to avoid damaging the semiconductor wafer and/or the probe substrate. Additionally, because of their size, the clamping devices add significant thermal resistance and thermal mass thereby increasing burn-in process time. Furthermore, the clamping devices are not portable making it difficult to transport and store them (i.e., they are heavy and take up substantial space).

As is readily apparent, materials and methods are needed that simplify WLBI and overcome at least the above problems. It would be of further advantage to do so in a cost effective and reliable manner.

DETAILED DESCRIPTION OF THE DRAWINGS

In general, the present invention involves materials and methods that provide temporary electrical contact between electronic components. In particular, the invention includes a removable, non-permanent, or water-soluble Z-axis anisotropically conductive adhesive (ACA) material comprising water, a matrix resin, and a plurality of conductive spheres.

Additionally, a method is described for providing electrical interconnection between electrical devices. The method includes depositing the removable Z-axis ACA material onto a first electrical device having a first conductive surface. The removable Z-axis ACA material is then placed into contact with a second electrical device having a second conductive surface. The conductive spheres within the removable Z-axis ACA material provide an electrical interconnection between the first and second conductive surfaces when the first and second electrical devices are energized or biased during, for example, device testing. Once testing is complete, the first and second electrical devices may be separated by dissolving the removable Z-axis ACA material. In a preferred embodiment, the removable Z-axis ACA material is used for wafer-level burn-in (WLBI).

Z-axis ACA materials typically are used as permanent adhesives to bond high-density printed-circuit assemblies including flexible interconnects and substrates. Permanent Z-axis ACA materials comprise non-water soluble resin materials that can withstand harsh environments and are not easily removed. Z-axis ACA materials conduct in one direction (e.g., in a vertical direction) and typically are used to provide a permanent conduction path between portions of an assembly.

Permanent Z-axis ACA materials are currently being developed by companies such as Poly-Flex Circuits Inc., 3M, Nippon Graphite, and AT&T Bell Labs for permanent printed-circuit assemblies. These permanent adhesives typically comprise proprietary mixtures of special resins and additives together with silver particles that provide the conduction path. Although these materials may be suitable as permanent adhesives, they are not suitable, for example, to temporarily bond a semiconductor substrate to a probe substrate for WLBI. This is because, among other things, they are difficult to remove from the substrates (i.e., strong solvents and extensive periods of time are necessary to breakdown or dissolve them). These strong solvents can cause irreversible damage to semiconductor devices and the probe substrates. These solvents also can damage the Conductive spheres Raking their re-use either impossible or limited.

Figure 1:
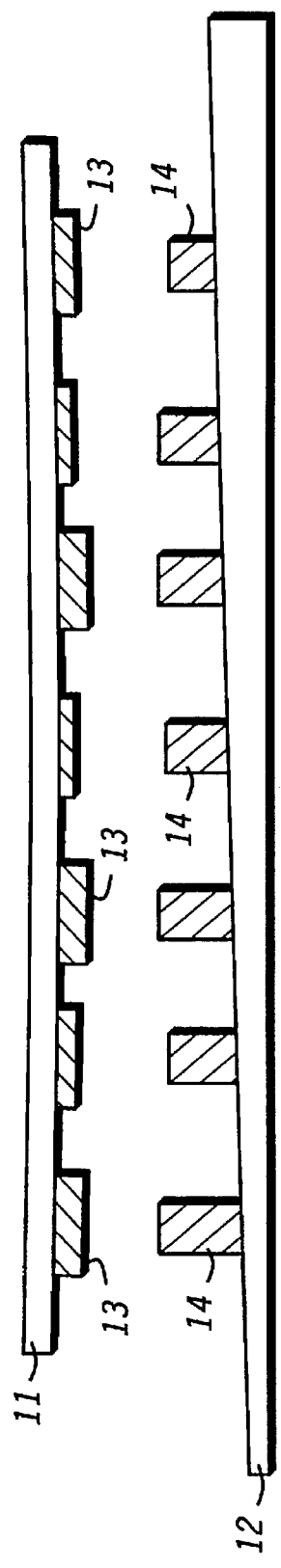
FIG. 1 illustrates an enlarged cross-sectional view of a semiconductor wafer and a probe substrate.

The present invention will now be described using a non-restrictive WLBI example. FIG. 1 shows an enlarged cross-sectional view of a semiconductor wafer or substrate 11 in proximity to a probe substrate 12. Semiconductor wafer 11 typically is referred to as a wafer-under-test (WUT) and includes wafer contact portions, bond pads, or bumps 13, which comprise a conductive material (e.g., a metal, a conductive polymer, or the like). Wafer contact portions 13 provide contact to individual IC devices formed on semiconductor wafer 11.

Probe substrate 12 typically comprises a ceramic or printed circuit board material and has several metallized probing objects or bumps 14 for making contact to wafer contact portions 13. Methods for forming wafer contact portions 13 and probing objects 14 are well known in the art. Probe substrate 12 typically is coupled (e.g., via an edge card connector (not shown)) to a test device for forcing voltage or current to IC devices formed on semiconductor wafer 11 and measuring current or voltage from the IC devices. Such test devices are well known in the art.

FIG. 1 illustrates several problems that manufacturers face with WLBI. For example, contact between wafer contact portions 13 and probing objects 14 is difficult because their thicknesses typically are non-uniform. Also, one of or both of semiconductor wafer 11 and probe substrate 12 typically are bowed or warped (as illustrated with wafer 11) or tapered (as illustrated with probe substrate 12). These problems must be overcome to provide effective WLBI.

To overcome the problems described above, manufacturers typically place an anisotropic Z-axis conductive rubber sheet between semiconductor wafer 11 and probe substrate 12. A clamping device is typically used to hold the materials together (i.e., a device capable of applying a large force is required to overcome non-uniform contact, warp, and taper problems). Clamping devices have several disadvantages. First, they require frequent adjustment to maintain proper contact between the semiconductor wafer, the rubber sheet, and the probe substrate to avoid causing damage to them. Also, clamping devices detrimentally impact burn-in process time because they add significant thermal resistance and thermal mass. Additionally, clamping devices are not portable making them difficult to transport and store.

Figure 2:
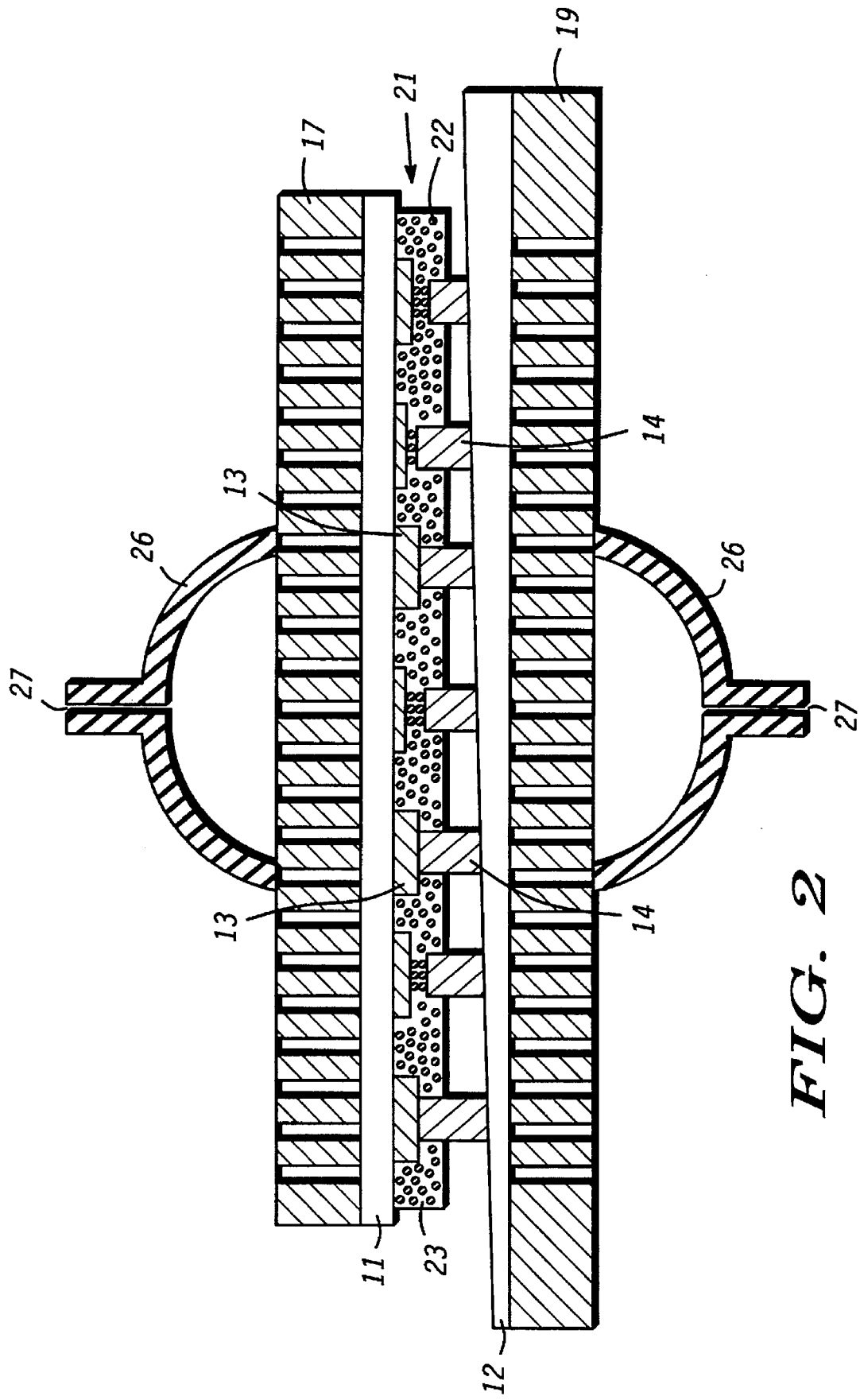
FIG. 2 illustrates an enlarged cross-sectional view of a WLBI assembly at an intermediate step according to the present invention.

FIG. 2 illustrates an enlarged cross-sectional view of a preferred WLBI assembly according to the present invention. FIG. 2 shows semiconductor wafer 11 coupled or reversibly attached to a vacuum or hold-down block 17 and probe substrate 12 coupled or reversibly attached to a vacuum or hold-down block 19. With a vacuum applied, vacuum blocks 17 and 19 function, among other things, to overcome the bow problems illustrated in FIG. 1. This minimizes the gaps between corresponding wafer contact portions 13 and probing objects 14.

Figure 3:
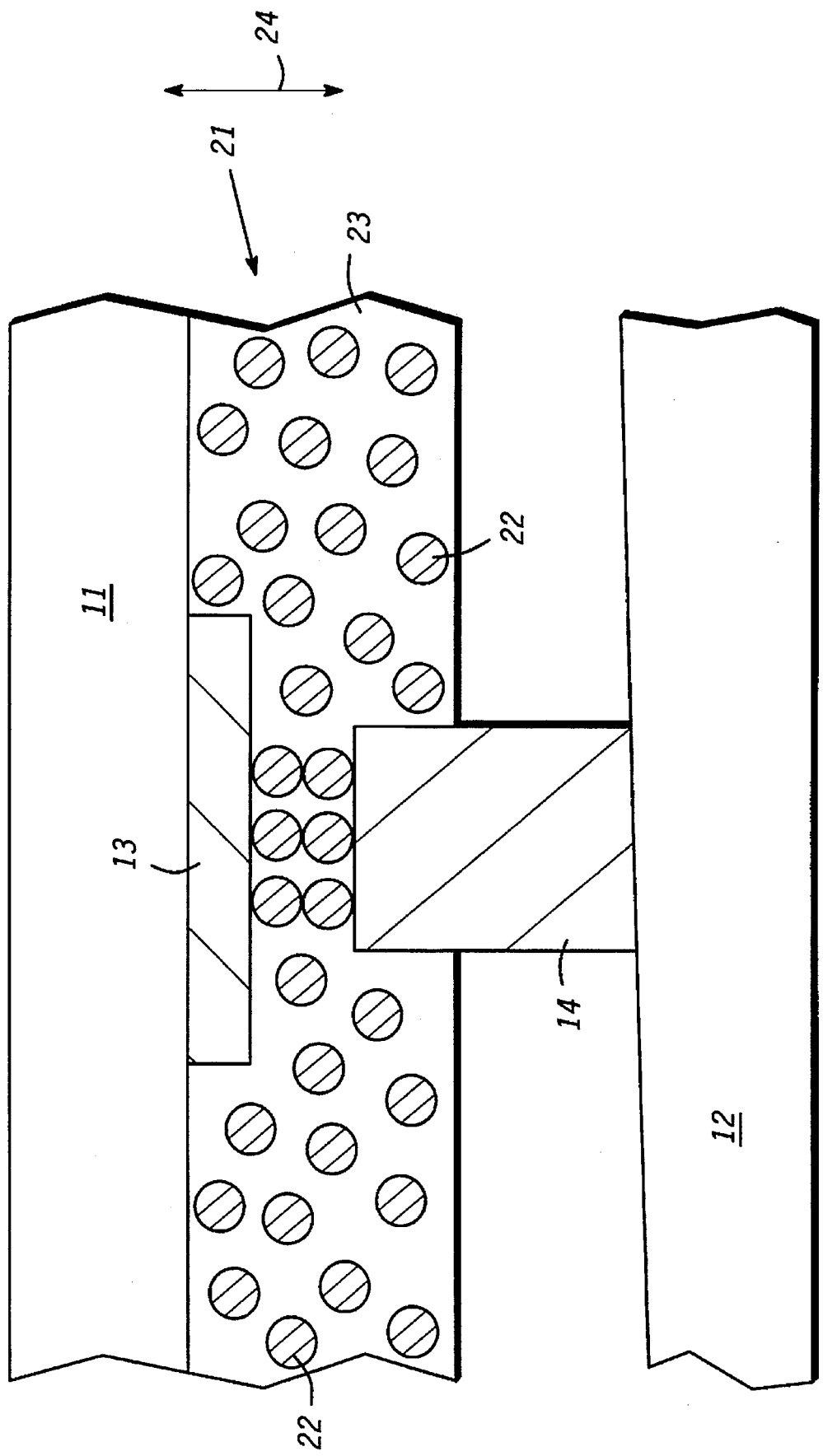
FIG. 3 illustrates an enlarged cross-sectional view of a portion of the assembly shown in FIG. 2.

One or both vacuum blocks 17 and 19 preferably include a ball joint device 26 for locking (e.g., using vacuum locks 27) the vacuum blocks in a desired position. Ball joint device 26 functions, among other things, to overcome the taper problem illustrated in FIG. 1 thereby co-planarizing semiconductor wafer 11 and probe substrate 12. FIG. 2 further shows removable, non-permanent, or water-soluble Z-axis anisotropically conductive adhesive (ACA) material 21 formed on semiconductor wafer 11. Removable Z-axis ACA material 21 is a removable polymer composite material including conductive spheres 22 within a water-soluble matrix resin 23. FIG. 3 illustrates a highly enlarged cross-sectional view of a portion of the WLBI assembly shown in FIG. 2. In particular, FIG. 3, shows conductive spheres 22 substantially aligned along z-axis 24 to provide electrical contact between one of wafer contact portions 13 and one of probing objects 14.

Removable Z-axis ACA material 21 functions, among other things, to overcome the taper and contact non-uniformity problems illustrated in FIG. 1. That is, it functions to create electrical contact between wafer contact portions 13 and probing objects 14. For a WLBI application, water-soluble matrix resin 23 preferably has a glass transition temperature (Tg) above the selected burn-in temperature (typically greater than about 85° C.) to produce good Z-axis conductivity. With such a Tg, good Z-axis conductivity is maintained because removable Z-axis ACA material 21 shrinks after a dehydration bake thereby applying a shrinkage or contractive force to semiconductor wafer 11 and probe substrate 12.

This is a significant advantage over the prior art because once removable Z-axis ACA material 21 is baked, semiconductor wafer 11 and probe substrate are bonded together by removable Z-axis ACA material 21 to maintain electrical contact, thus eliminating the need for a clamping device. This provides a very portable structure that is easy to transport and easy to store (this is shown as structure 41 in FIG. 4). Furthermore, burn-in process time is greatly reduced because the thermal resistance and thermal mass of the clamping device is eliminated.

Matrix resin 23 comprises a thermoplastic resin (e.g., polyacrylic acid or the like) that is soluble in water. Preferably, matrix resin 23 is substantially soluble in water to minimize the need to add organic solvents to dissolve matrix resin 23. By being soluble in water, matrix resin 23 is easily removed without damaging semiconductor wafer 11 or probe substrate 12. Also, this allows a manufacturer to easily retrieve and recycle at least a portion of conductive spheres 22 without damaging conductive spheres 22 and without generating hazardous wastes. Optionally, a di-functional monomer (e.g., butenediol di-glycidyl ether, hexanediol di-glycidyl ether, or the like) is added to increase the cross-linking of matrix resin 23.

Conductive spheres 22 typically comprise metal spheres (e.g., gold plated nickel spheres) or metal plated plastic spheres (e.g., gold plated DVB-styrene spheres). Such spheres are available from suppliers such as Zymet Inc. located in East Hanover, N.J. The diameter of conductive spheres 22 is selected depending upon the pitch or spacing between adjacent wafer contact portions 13. Preferably, conductive spheres 22 have a diameter in a range from about 1.0 micron to about 100 microns.

In a preferred embodiment suitable for about a 100° C. burn-in, removable Z-axis ACA material 21 is prepared as follows. First about a 5% to about a 25% by weight aqueous solution of polyacrylic acid (PAA) with a molecular weight of about 450,000 grams/mole is prepared (with about a 13% to about a 15% by weight preferred) by dissolving about 0.75 to about 0.85 grams of PAA in about 4.8 to about 5.0 grams of water. Next, bubbles are removed from the aqueous solution using, for example, ultrasound techniques. During the bubble removing process, the aqueous solution becomes clear and has a viscosity on the order of 5,000 centipoise.

Next, conductive spheres 22 are added to the aqueous solution to provide about a 1% to about a 10% particle loading (with about 5% preferred). For example, about 10 to 11 milligrams (mg) of gold-plated DVB-styrene spheres with a diameter on the order of about 12 microns are added to about 200 mg to about 220 mg of matrix resin 23 to provide removable Z-axis ACA material 21.

Optionally, removable Z-axis ACA material 21 further includes a modifier (e.g., a water soluble solvent such as propanol) to provide a more uniform film thickness when removable Z-axis ACA material 21 is applied to semiconductor wafer 11. Additionally, removable Z-axis ACA material 21 further includes an anti-foaming agent (e.g., a silicone defoamer) to reduce foaming.

In a preferred method for performing WLBI, removable Z-axis ACA material 21 is applied to semiconductor wafer 11. Alternatively, removable Z-axis ACA material 21 is applied to probe substrate 12. Typically, removable Z-axis ACA material 21 is applied using conventional dispense and spin application techniques. Alternatively, removable Z-axis ACA material 21 is applied with squeegee or brush application techniques. Such techniques are well known in the art. Typically, a layer about 20 microns thick is applied. This thickness is adjusted according to the actual thickness Of wafer contact portions 13 and probing objects 14, their thickness variations, and the diameter of conductive spheres 22.

Next, semiconductor wafer 11 is placed into contact with vacuum block 17 and a vacuum is applied to overcome any bow or warp in semiconductor wafer 11. Likewise, probe substrate 12 is placed into contact with vacuum block 19 and a vacuum is applied to overcome any bow or warp in probe substrate 12. Once vacuum is applied, wafer contact portions 13 are aligned with the corresponding probing objects 14 and then pressed into contact with each other. In those portions where a gap exists between one of wafer contact portions 13 and one of probing objects 14, removable Z-axis ACA material 21 functions to fill the gap to provide a conduction path as shown in FIGS. 2 and 3.

To facilitate the alignment and attachment process between wafer contact portions 13 and probing objects 14, a ball joint device 26 (shown in FIG. 2) is attached to either one of or both vacuum blocks 17 and 19. Preferably, ball joint device 26 includes a vacuum lock 27 so that once alignment and co-planarity are achieved, ball joint device 26 can be vacuum locked to maintain a desired position.

While semiconductor wafer 11 and probe substrate 12 are pressed together, the WLBI assembly is exposed to an appropriate dehydration bake temperature. For example, with the PAA resin material discussed above, the WLBI assembly is exposed to about 95° C. for about 1 to 3 hours in an oven. After the dehydration bake, semiconductor wafer 11 remains in a bonded connection with probe substrate 12. This bonded connection is conductive due to the contractive nature of removable Z-axis ACA material 21 after bake. The bonded connection typically does not require an external force to maintain. Optionally, a minimal force (e.g., less than about 1 g/wafer contact portion) is used, which is significantly less than prior art clamping device,s where about 30 g/wafer contact portion typically is required.

Figure 4:
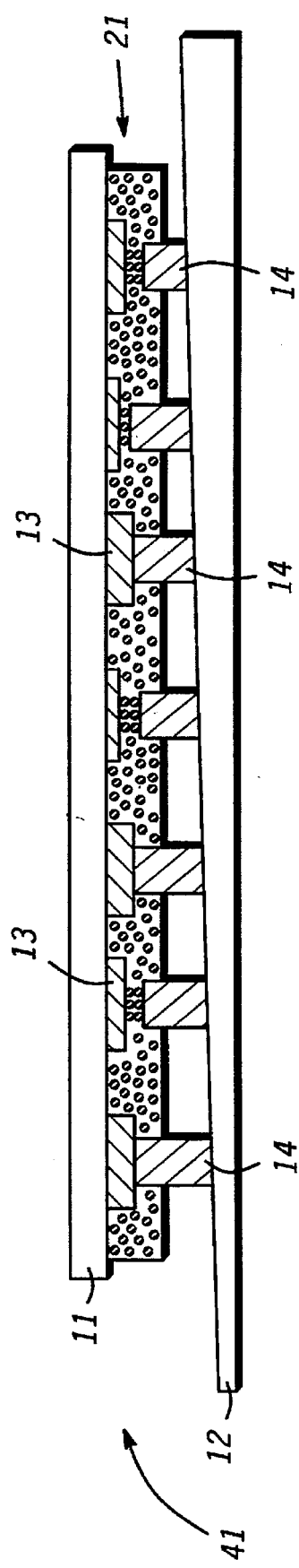
FIG. 4 illustrates a portion of an WLBI assembly at later step according to the present invention.

Once removable Z-axis ACA material 21 is baked or dried enough to provide electrical contact, semiconductor wafer 11, removable Z-axis ACA material 21, and probe substrate 12 are removed from vacuum blocks 17 and 19 to provide structure 41 shown in FIG. 4. Structure 41 is then placed in a burn-in apparatus such as an Aehr Test burn-in system, available from Aehr Test Systems of Mountain View, Calif. Typically, probe substrate 12 includes an edge card connect (not shown), which functions to interface probe substrate 12 to a testing apparatus. The IC devices on semiconductor wafer 11 are then tested at an elevated temperature under the appropriate bias conditions to screen out any defective devices.

After burn-in, semiconductor wafer 11 is separated from probe substrate 12 by dissolving removable Z-axis ACA material 21 in water. For example, the preferred PAA removable Z-axis ACA material discussed above dissolves in about 1.0 to 2.0 hours. Once dissolved, conductive spheres 22 are easily retrieved using filtration, centrifugation, or similar means and can be re-used. This is a significant cost saving feature of the present invention. Alternatively, semiconductor wafer 11 and probe substrate 12 are separated by heating them to a temperature above the Tg of removable Z-axis ACA material 21. Residual removable Z-axis ACA material 21 is then dissolved in, for example, water.

In an alternative embodiment, semiconductor wafer 11 is first brought into alignment and contact with probe substrate 12. The space between semiconductor wafer 11 and probe substrate 12 is then filled with removable Z-axis ACA material 21. Removable Z-axis ACA material 21 is then baked and burn-in is carried out as described above.

By now it should be apparent that a removable Z-axis ACA material has been provided. The material includes water, a matrix resin and a plurality of conductive spheres. The material is suitable for WLBI and greatly simplifies the process by eliminating the need for clamping devices. By being water soluble, the removable Z-axis ACA material does not require large quantities of organic solvents, which can be hazardous. Also, by being water soluble, the conductive spheres are easily retrieved and re-used after burn-in thus providing a cost savings.

The application of this removable Z-axis ACA material in WLBI is one of many potential applications that involve forming temporary interconnects between two conducting surfaces. Various other similar embodiments and modifications may be made by those skilled in the art without departing from the spirit and scope of the appended claims.

We claim:

1. A wafer-level burn-in method comprising the steps of:

providing a semiconductor wafer having a plurality of wafer contact portions;

providing a probe substrate having a plurality of probing objects;

placing a removable Z-axis ACA material comprising water, a water-soluble matrix resin, and a plurality of conductive particles on one of the semiconductor wafer and the probe substrate, wherein the removable Z-axis ACA material has glass transition temperature greater than a selected burn-in temperature;

placing the semiconductor wafer into contact with the probe substrate;

baking the removable Z-axis ACA material to shrink the removable Z-axis material thereby applying a contractive force between the semiconductor wafer and the probe substrate;

placing the semiconductor wafer and the probe substrate into a burn-in apparatus; and subjecting the semiconductor wafer to the selected burn-in temperature and a bias.

2. The method of claim 1 wherein the step of placing the removable Z-axis ACA material includes placing the removable Z-axis ACA material, wherein the water-soluble matrix resin comprises polyacrylic acid.

3. The method of claim 1 further comprising the steps of:

dissolving the water-soluble matrix resin after the step of subjecting the semiconductor wafer to the selected burn-in temperature and bias to separate the semiconductor wafer from the probe substrate and to release the plurality of conductive particles from the water-soluble matrix resin; and recovering at least a portion of the plurality of conductive particles for subsequent re-use in Z-axis anisotropically conductive materials.

4. The method of claim 2 wherein the step of placing the removable Z-axis ACA material includes placing the removable Z-axis ACA material, wherein the removable Z-axis ACA material comprises about a 5% to about a 25% by weight aqueous solution of polyacrylic acid.

5. The method of claim 1 further comprising the step of:

placing the semiconductor wafer onto a first vacuum block;

applying a vacuum to the semiconductor wafer to reduce any bow in the semiconductor wafer;

placing the probe substrate onto a second vacuum block; and applying a vacuum to the probe substrate to reduce any bow in the probe substrate, wherein the steps of placing the semiconductor wafer onto the first vacuum block and placing the probe substrate onto the second vacuum block are done before placing the semiconductor wafer into contact with the probe substrate.

6. The method of claim 1 wherein the step of placing the removable Z-axis ACA material includes placing the removable Z-axis ACA material, wherein the removable Z-axis ACA material further comprises one of a di-functional monomer, a modifier and an anti-foaming agent.

7. A method for providing electrical interconnection between electrical devices comprising the steps of:

depositing a Z-axis ACA material onto a first electrical device, wherein the first electrical device has a first conductive surface, and wherein the Z-axis ACA material comprises water, polyacrylic acid, and a plurality of conductive particles; and placing the Z-axis ACA material into contact with a second electrical device, wherein the second electrical device has a second conductive surface, and wherein the plurality of conductive particles provide an electrical interconnection between the first and second conductive surfaces when the first and second electrical devices are energized.

* * * * *